United States Patent [19]

Bernstein et al.

[11] Patent Number: 4,937,174

[45] Date of Patent: Jun. 26, 1990

[54] PROCESS OF OBTAINING IMPROVED CONTRAST IN ELECTRON BEAM LITHOGRAPHY

[75] Inventors: Gary Bernstein, Tempe; David K. Ferry, Chandler; Wenping Liu, Tempe, all of Ariz.

[73] Assignee: Arizona Board of Regents, Tempe, Ariz.

[21] Appl. No.: 380,029

[22] Filed: Jul. 14, 1989

Related U.S. Application Data

[62] Division of Ser. No. 159,777, Feb. 24, 1988, Pat. No. 4,877,716.

[51] Int. Cl.$^5$ ........................... G03C 5/34; G03C 5/24
[52] U.S. Cl. ..................................... 430/309; 430/302; 430/325; 430/331
[58] Field of Search ............... 430/309, 331, 302, 313, 430/325

[56] References Cited

U.S. PATENT DOCUMENTS

| | | | |
|---|---|---|---|
| 4,348,471 | 9/1982 | Shelnut et al. | 430/165 |
| 4,350,753 | 9/1982 | Shelnut et al. | 430/190 |
| 4,476,217 | 10/1984 | Douglas et al. | 430/326 |
| 4,551,387 | 11/1985 | Manabe et al. | 430/326 |

FOREIGN PATENT DOCUMENTS 206717 12/1986 European Pat. Off. .
97344 8/1981 Japan .

OTHER PUBLICATIONS

Harada et al., "Detailed Contrast Measurements . . . ", Solid State Science and Technology, vol. 129, No. 11, Nov. 1982, pp. 2576-2578.
Taylor, Gary, "Guidelines for Publication . . . ," Solid State Technology, Jun. 1984, pp. 105-110.
Craighead, H. G., "Ultra-High Resolution . . . ," Journal of Electron Microscopy Technique, 2:147-155 (1985).
Mackie et al., "Materials and Processes for Nanometer Lithography", Solid State Technology, 8/85, pp. 117-122.

*Primary Examiner*—Paul R. Michl
*Assistant Examiner*—Patrick Doody
*Attorney, Agent, or Firm*—Richard R. Mybeck

[57] ABSTRACT

An improved developer for PMMA, electron resist comprising an effective amount of MEK in combination with MIBK or CS alone or a mixture thereof and a process of obtaining improved contrast in electron beam lithography therewith.

6 Claims, 3 Drawing Sheets

PROCESS OF OBTAINING IMPROVED CONTRAST IN ELECTRON BEAM LITHOGRAPHY

This application is a divisional from our copending application Ser. No. 159,777 filed Feb. 24, 1988 now U.S. Pat. No. 4,877,716.

INTRODUCTION

This invention relates to developer solutions for electron beam lithography and more particularly relates to improved developer solutions for PMMA electron resist and to improved high resolution electron beam lithography processes employing same.

BACKGROUND OF THE INVENTION

Electron beams of narrow dimensions and high energies are commonly employed to create patterns on semiconductor wafers and masking materials by altering the chemical nature of a resist overlayer. In electron sensitive resist polymethylmethacrylate (PMMA) bonds are broken, decreasing the average molecular weight of the long chain molecules. This increases the solubility of the resist in a suitable developer, allowing the exposed pattern to be indented into the resist. In further processing steps, the pattern is transferred by various techniques to the substrate material. An important limitation on the density of the exposed pattern, and in some respects the individual line widths, is the back-scattering of electrons from the substrate, causing exposure of the resist several microns away from the area of the primary exposure. This phenomenon, causing the proximity effect, reduces the definition of the exposed pattern.

As lines are placed closer together, the total dose increases between the primary exposed regions due to the proximity effect, thus leading to a decreased differential in exposure. The requirements of the developer to distinguish between the difference in doses becomes more stringent if the pattern is to be resolved. Ideally, a developer will develop (i.e. remove) all resist which has been exposed to a dose above a certain threshold and none of the resist which has been exposed below that threshold. In practice, a range of exposures results in partial development of the resist.

The general process of high resolution electron beam lithography with a PMMA resist is described by H. G. Craighead, "10-nm Resolution electron beam lithography", *J. Appl. Phys.* 55:4430-4435 (1984). See also H. G. Craighead, "Ultra-High Resolution Electron-Beam Lithography", *J. Electron Microscopy Technique*, 2: 147-155 (1985); S. Mackie et al., "Materials and Processes for Nanometer Lithography", *Solid State Technology/August* 1985, 117-122; and K. Harada et al., "Detailed Contrast γ(-Value) Measurements of Positive Electron Resists", *J. Electrochem. Soc.*, Nov. 1982, 2576-2580.

Three chemical solutions are commonly employed as electron-resist developers. These are:.(1) methylethylketone:ethanol in a ratio of 23.5:76.5 (v/v), referred to as "MEK"; (2) 2-ethoxyethanol (Cellosolve): methanol in a ratio of 3:7 (v/v), referred to as CS; and (3) methylisobutylketone: 2-propanol in a ratio of 25:75 (v/v), referred to as MIBK. Of these, MEK is the poorest for high resolution applications and its use is restricted to applications which do not require high contrast.

We have discovered that the addition of small amounts of MEK to either CS or MIBK alone or in a mixture of these developers unexpectedly and drastically improves contrast and reduces the required dose, thereby providing a significantly improved developer for PMMA resist applications in high resolution electron beam lithography, and hence improved processes for fabricating integrated circuits.

SUMMARY OF THE INVENTION

The present invention provides an improved developer solution for the PMMA electron resist commonly employed in electron beam lithography. PMMA is useful as a resist material in optical lithography employing deep ultra violet radiation and x-ray lithography as well as electron beam lithography. The exposure mechanism in all three cases for polymer chain scission is similar, therefore the developer of the present invention should be useful for use therewith.

In the preferred embodiment, the improved developer of this invention consists of an intimate mixture of from 0.5 to 5 percent by volume of MEK, from 30 to 48 percent by volume of CS and from 50 to 67 percent by volume of MIBK.

The present invention also provides an improved electron beam lithography process employing the developer of the present invention. The new developer solutions allow the fabrication of extremely narrow lines of very high pitch, thereby providing an advance in the process of electron beam lithography for the fabrication of integrated circuits.

The term "PMMA", as used herein, refers to polymethylmethacrylate.

The term "MEK" refers to the electron resist developer methylethylketone: methanol in a ratio of 23.5:76.5 (v/v).

The term "CS", as used herein, refers to the electron resist developer 2-ethoxyethanol (Cellosolve): methanol in a ratio of 3:7 (v/v).

The term "MIBK", as used herein, refers to the electron resist developer methylisobutylketone: 2-propanol in a ratio of 25:75 (v/v).

BRIEF DESCRIPTION OF THE DRAWINGS

The invention will be more readily understood from the following description and claims, taken in conjunction with the drawings in which:

DETAILED DESCRIPTION OF PREFERRED EMBODIMENTS

The present invention, in its broadest aspect, provides an improved PMMA electron resist developer consisting essentially of an effective amount of MEK in combination with a developer selected from the group consisting of MIBK and CS alone or in combination.

In one preferred embodiment, the improved PMMA resist developer of this invention comprises from 0.5 to 5 percent by volume of MEK, from 0 to 48 percent by volume of CS and from 0 to 50 percent by volume of MIBK.

In an especially preferred embodiment, the PMMA resist developer comprises from 1 to 5 percent by volume of MEK, from 30 to 48 percent by volume of CS and from 60 to 67 percent by volume of MIBK.

The presently preferred developer of this invention consists essentially of 50 percent by volume of MIBK, 45.5 percent by volume of CS and 4.5 percent by volume of MEK. Expressed another way, the developer comprises MIBK/CS/MEK in a ratio 11:10:1.

Figure 1:
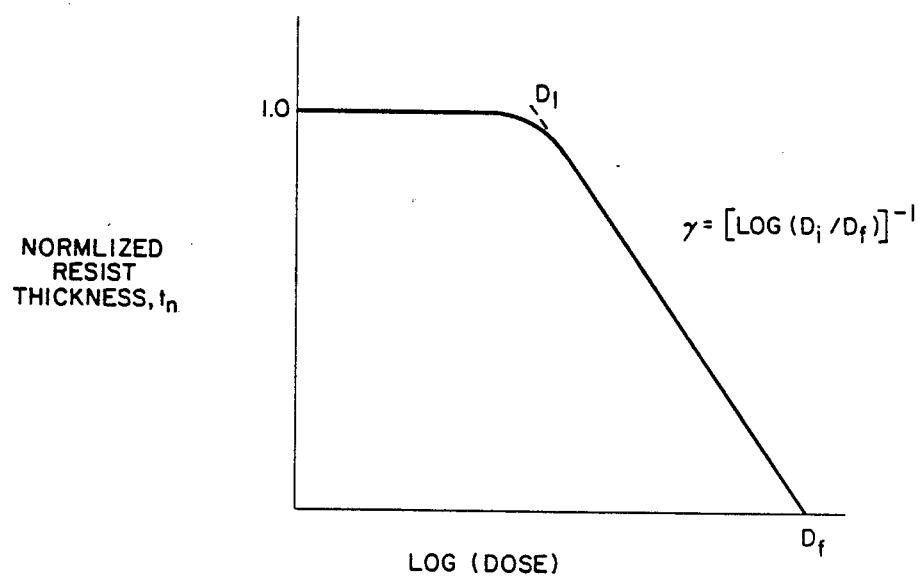
FIG. 1 is a graph illustrating the definition of contrast.
Figure 2:
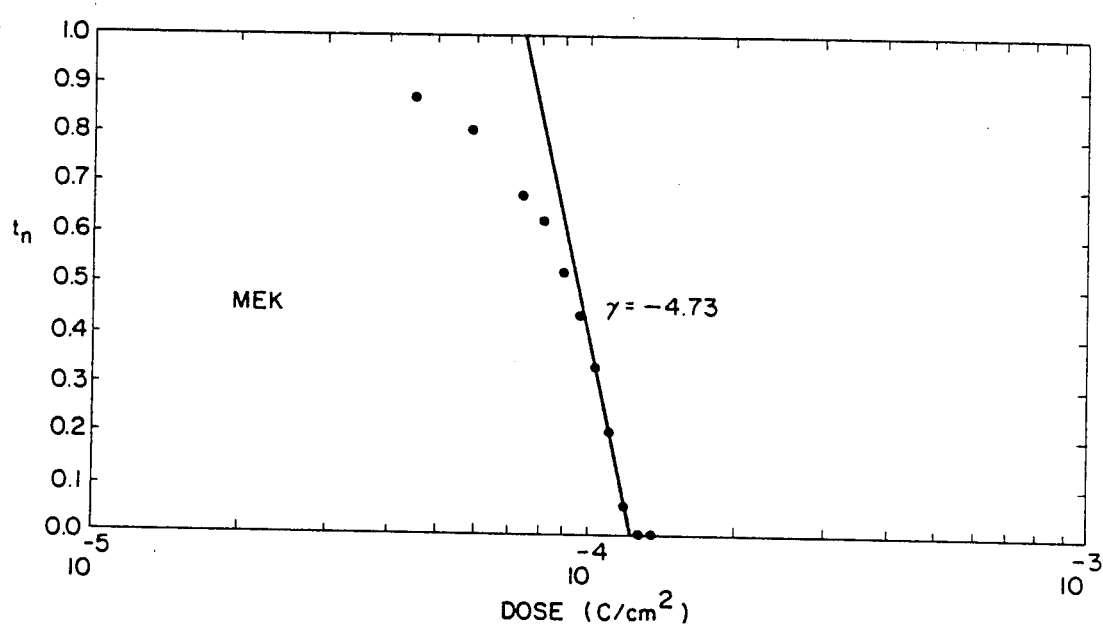
FIG. 2 is a contrast plot for MEK developer.
Figure 3:
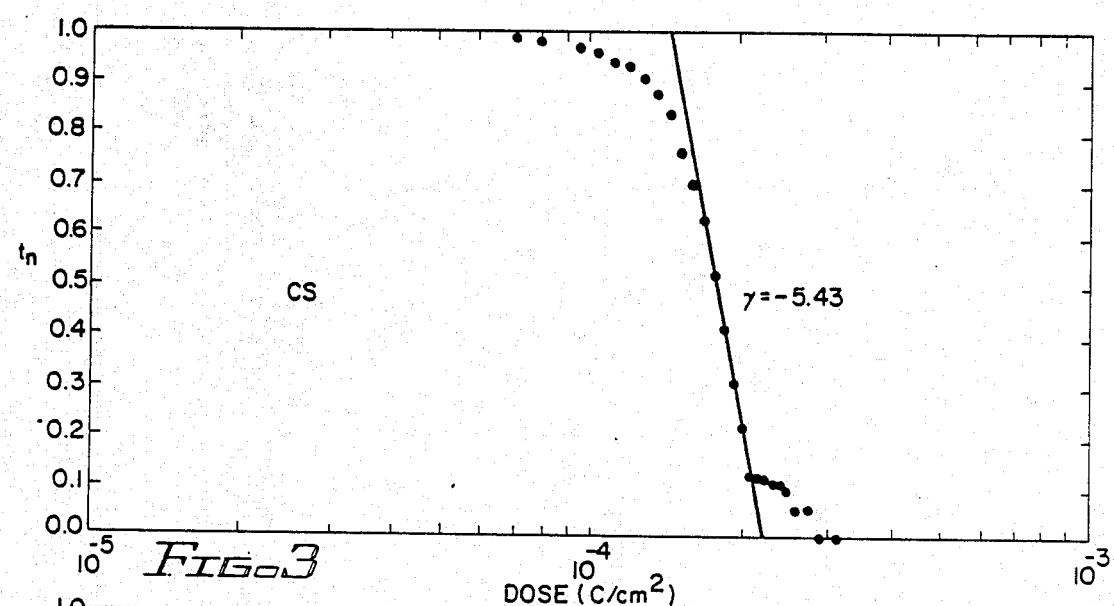
FIG. 3 is a contrast plot for CS developer.
Figure 4:
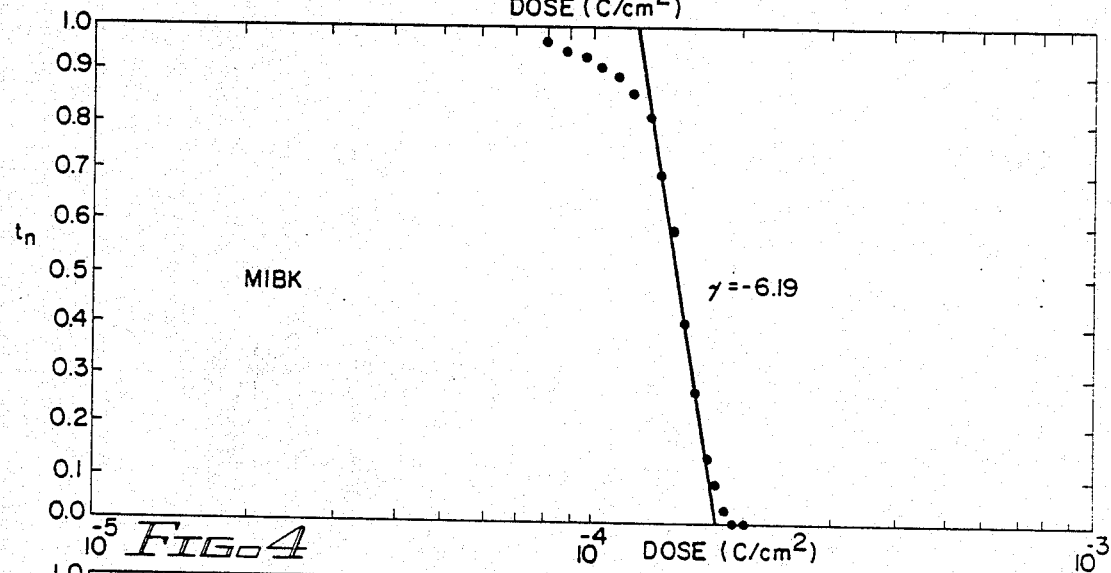
FIG. 4 is a contrast plot for MIBK developer.
Figure 5:
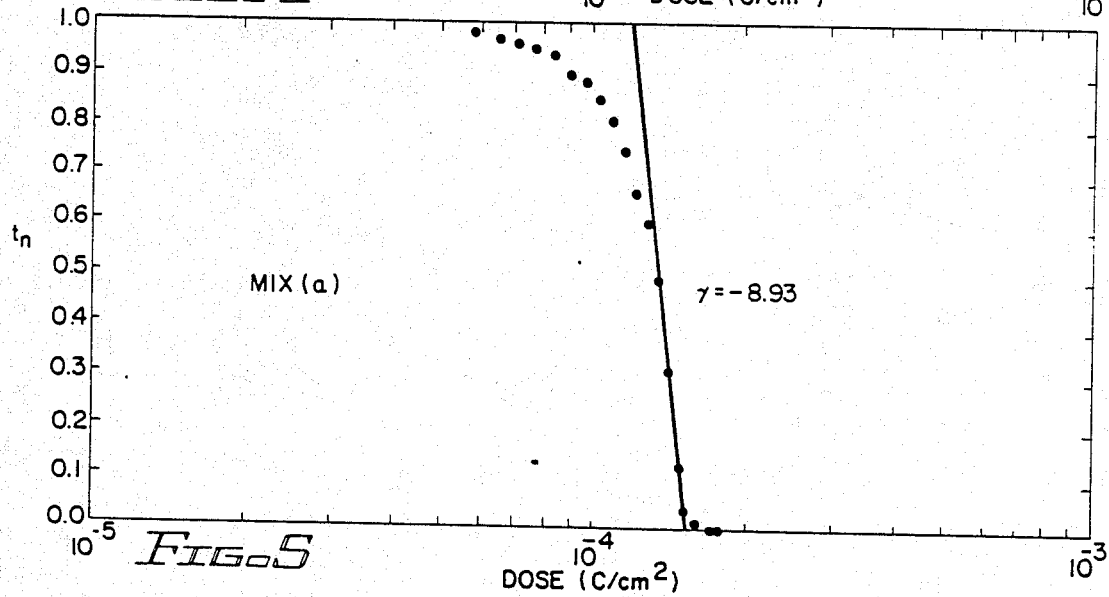
FIG. 5 is a contrast plot for the preferred embodiment of this invention, mixture (a)

A measure of the sharpness of the developing threshold is called the contrast $\gamma$, of the developer. Contrast is defined as the slope of the plot of normalized thickness of the resist versus the logarithm of the exposure dose. FIG. 1 illustrates the definition of contrast. The slope of this curve, $\gamma$, (negative for positive resists such as PMMA) is a measure of the ability of the developer to distinguish between gradations of dose. It is seen that $\gamma$ is expressed as $[\log(D_i/D_f)]^{-1}$ so that a higher absolute value of $\gamma$ represents a higher contrast developer. All values reported below are expressed without a sign indication, since all are negative indicating positive results. The ideal situation discussed above represents an infinite contrast, whereas in practice, the contrast is always finite. Contrast can be measured experimentally by varying the electron exposure dose in small increments through the region of dose which causes the resist to dissolve until total dissolution is achieved. The normalized resist thickness is plotted as a function of the logarithm of exposure dose, with the slope of the steepest portion yielding $\gamma$.

The three chemical solutions commonly employed as PMMA electron-resist developers, MEK, CS and MIBK were tested separately using develop times which yielded approximately the same dose for complete development, $D_f$. These times were 45 seconds for MIBK, 5 seconds for CS and 2 seconds for MEK. MIBK dissolves PMMA more slowly than does CS and requires less dose for complete resist removal. MEK has the highest dissolution rate and the lowest $D_f$. MEK by itself, is not a very satisfactory developer because of its low contrast, and is therefore not used for high resolution electron beam lithography.

However, we have unexpectedly found that the addition of small amounts of MEK to MIBK or CS alone or in combination, significantly improves contrast obtained with MIBK alone, CS alone or mixtures of MIBK and CS. This enhancement effect is not seen by simply combining MIBK and CS, and is unexpected because of the poor contrast obtained with MEK alone. The developer of this invention yielded an improvement in of 50% over MIBK, the best developer, in addition to a reduction in $D_f$ of 15%.

The relative performances of MEK, MIBK and CS alone and the developer of the present invention were evaluated with 550 nm of 950,000 AMU PMMA on silicon substrates exposed with 40 kV electrons. MEK, MIBK and CS were tested separately using development times which yielded approximately the same dose for complete development, $D_f$. These times were 45 seconds for MIBK, 5 seconds for CS and 2 seconds for MEK. The relative dissolution rates of these developers are directly related to $D_f$. For example, MIBK dissolves PMMA more slowly than does CS and requires less dose for complete resist removal. MEK has the highest dissolution rate and the lowest $D_f$.

Mixtures of MEK with CS and MIBK alone and in combination were evaluated in identical fashion, using a 10 second development time. The mixtures employed were MIBK/CS/MEK in ratios of (a) 11:10:1; (b) 21:20:1 and (c) 42:20:1. All of these mixtures gave higher values of $\gamma$ as well as lower values of $D_f$ than any of the standard developers. Further, it was found that adding a small amount of MEK to either CS or MIBK alone also unexpectedly improved their characteristics.

Table 1 sets forth the data for the three standard developers as well as the preferred developer of this invention, referred to as mixture (a), which gave the highest values of $\gamma$ overall.

TABLE I

| Developer | $\gamma$ | $D_f(C/cm^2)$ |
|---|---|---|
| MEK | 4.73 | $1.22 \times 10^{-4}$ |
| CS | 5.43 | $2.20 \times 10^{-4}$ |
| MIBK | 6.19 | $1.77 \times 10^{-4}$ |
| mixture (a) | 8.93 | $1.54 \times 10^{-4}$ |

As can be seen from the data, the highest contrast of the standard developers was $\gamma=6.19$ whereas the contrast of the developer of this invention was found to be $\gamma=8.93$.

FIGS. 2-5 show the contrast curves for MEK alone, CS alone, MIBK alone and the developer of this invention, respectively. The developer of this invention yielded an improvement in $\gamma$ of 50% over MIBK in addition to a reduction in $D_f$ of 15%. This is both unexpected and significant.

Figure 6:
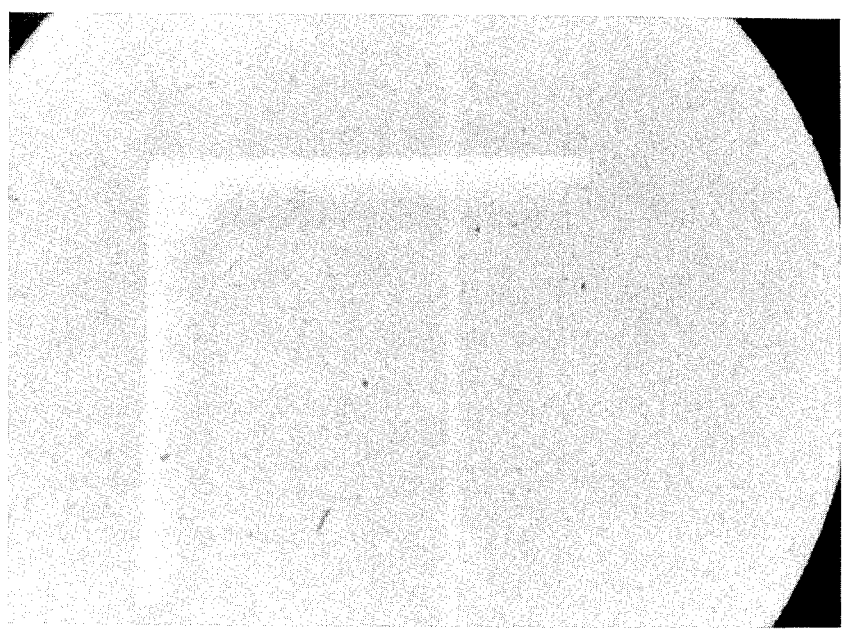
FIG. 6 is a photomicrograph of lines and grids developed with MIBK.
Figure 7:
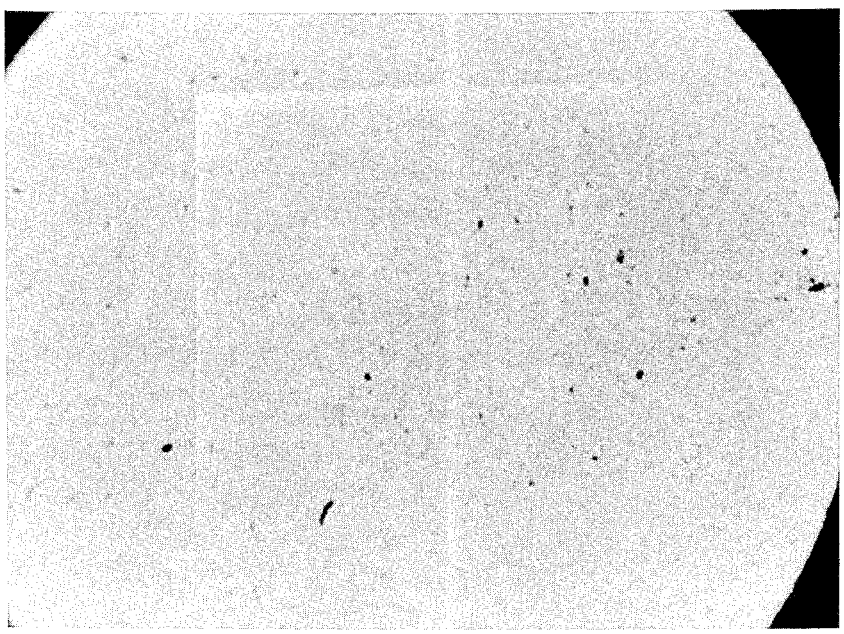
FIG. 7 is a photomicrograph of lines and grids developed with mixture (a).

The improved contrast can best be seen in FIGS. 6 and 7. Very dense grids were exposed identically and developed using the two solutions, MIBK alone and the preferred embodiment, a developer consisting essentially of MIBK : CS : MEK in a ratio of 11:10:1 [v/v/v](50% to 45.5% to 4.5% by volume). A characteristic of lower contrast is that dense grids are washed out in the development process due to the proximity effect. This can be seen by FIG. 6, as the bright area at the intersection of the two rectangles (actually a series of parallel lines). A higher contrast developer is expected to develop only the exposed lines of the grid and not wash out the areas between them. FIG. 7 shows that this is indeed the case for the present developer, as the grid area is more uniformly developed. This is conclusive evidence of the effectiveness of the developer solutions and the process of this invention.

Their use allows the fabrication of extremely narrow lines of very high pitch. FIG. 8 shows 30-nm gold lines on a 95-nm pitch. These are higher densities than have been heretofore achieved with any of the other constituent developers using a 40 kV electron beam on solid substrates.

By employing the developer solution of this invention in place of standard PMMA resist developers in electron beam lithography processes, greatly improved results are obtained. That is, it is now possible to fabricate extremely narrow lines of very high pitch in settings other than the laboratory.

While specific ranges and amounts of components have been disclosed and claimed, it will be obvious to those skilled in the art that minor variations can be employed without departing from the spirit and scope of the invention.

We claim:

1. In a process for improving the contrast achieved with PMMA resist developer in electron beam lithography, the improvement comprising employing a developer selected from the group consisting of Methylisobutylketone:z-propanol in a ratio of 25:75 (v/v) and 2-ethoxyethanol:methanol in a ratio of 3:7 (v/v) to which has been added an effective amount of methylethylketone:ethanol in a ratio of 23.5:76.5 (v/v).

2. The process of claim 1 wherein from 0.5 to 5 percent by volume of methylethylketone: ethanol in a ratio of 23.5:76.5 (v/v) is added to the developer prior to processing.

3. The process of claim 1 wherein said developer comprises from 1 to 5 percent by volume of methylethylketone:ethanol in a ratio of 23.5:76.5 (v/v), from 30 to 48 percent by volume of 2-ethoxyethanol:methanol in a ratio of 3:7 (v/v) and from 50 to 70 percent by volume of Methylisobutylketone:z-propanol in a ratio of 25:75 (v/v).

4. The process of claim 1 wherein said developer comprises 50 percent by volume of Methylisobutylketone:z-propanol in a ratio of 25:75 (v/v), 45.5 percent by volume of 2-ethoxyethanol:methanol in a ratio of 25:75 (v/v) and 4.5 percent volume of methylethylketone:ethanol in a ratio of 23.5:76.5 (v/v).

5. The process of claim 1 wherein said developer comprises 50 percent by volume of Methylisobutylketone:z-propanol in a ratio of 25:75 (v/v), 47.6 percent by volume of 2-ethoxyethanol:methanol in a ratio of 3:7 (v/v) and 2.4 percent volume of methylethylketone:ethanol in a ratio of 23.5:76.5 (v/v).

6. The process of claim 1 wherein said developer comprises 66.7 percent by volume Methylisobutylketone:z-propanol in a ratio of 25:75 (v/v), 31.7 percent by volume of 2-ethoxyethanol:methanol in a ratio of 3:7 (v/v) and 1.6 percent volume of methylethylketone:ethanol in a ratio of 23.5:76.5 (v/v).

* * * * *

UNITED STATES PATENT AND TRADEMARK OFFICE
CERTIFICATE OF CORRECTION

PATENT NO. : 4,937,174

DATED : June 26, 1990

INVENTOR(S) : Gary H. Bernstein et al

It is certified that error appears in the above-identified patent and that said Letters Patent is hereby corrected as shown below:

Insert a second paragraph in the section entitled "INTRODUCTION":

---This invention was made with Government support under contract No. N 00014-84-K-0053 awarded by the Department of the Navy. The Government has certain rights in the invention.---

Signed and Sealed this

Twenty-sixth Day of January, 1993

Attest:

DOUGLAS B. COMER

Attesting Officer     Acting Commissioner of Patents and Trademarks